United States Patent
Chen et al.

(10) Patent No.: US 11,450,626 B2
(45) Date of Patent: Sep. 20, 2022

(54) SEMICONDUCTOR PACKAGE

(71) Applicant: Taiwan Semiconductor Manufacturing Company, Ltd., Hsinchu (TW)

(72) Inventors: Yang-Che Chen, Hsin-Chu (TW); Victor Chiang Liang, Hsinchu (TW); Chen-Hua Lin, Yunlin County (TW); Chwen-Ming Liu, Hsinchu (TW); Huang-Wen Tseng, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/002,758

(22) Filed: Aug. 25, 2020

(65) Prior Publication Data
US 2022/0068845 A1   Mar. 3, 2022

(51) Int. Cl.
*H01L 23/60*   (2006.01)
*H01L 23/31*   (2006.01)
*H01L 23/00*   (2006.01)

(52) U.S. Cl.
CPC ............. *H01L 23/60* (2013.01); *H01L 23/31* (2013.01); *H01L 24/14* (2013.01)

(58) Field of Classification Search
None
See application file for complete search history.

(56) References Cited

U.S. PATENT DOCUMENTS

| | | | | |
|---|---|---|---|---|
| 5,497,546 A * | 3/1996 | Kubo | ................... | H01L 21/486 219/85.13 |
| 5,814,535 A * | 9/1998 | Shimada | ............... | H01L 21/486 438/122 |
| 6,404,611 B1 * | 6/2002 | Taran | ................... | H01L 23/055 257/E23.063 |
| 6,573,590 B1 * | 6/2003 | Radu | ...................... | H01L 23/10 257/659 |
| 6,818,839 B2 * | 11/2004 | Hosaka | ................. | H01R 12/57 174/262 |
| 6,847,106 B1 * | 1/2005 | Howard | .................. | H01L 23/10 257/687 |
| 6,943,436 B2 * | 9/2005 | Radu | ..................... | H01L 23/552 257/659 |

(Continued)

*Primary Examiner* — Bo B Jang
(74) *Attorney, Agent, or Firm* — JCIPRNET

(57) ABSTRACT

A semiconductor package includes a multilayer substrate, a device die, an insulating encapsulant, and a shielding structure. The multilayer substrate has a first surface and a second surface opposite to the first surface. The multilayer substrate includes through holes, and each of the through holes extends from the first surface to the second surface. The device die is disposed on the first surface of the multilayer substrate. The insulating encapsulant is disposed on the first surface of the multilayered substrate and encapsulating the device die. The shielding structure is disposed over the first surface of the multilayer substrate. The shielding structure includes a cover body and conductive pillars. The cover body covers the device die and the insulating encapsulant. The conductive pillars are connected to the cover body and fitted into the through holes of the multilayer substrate.

20 Claims, 11 Drawing Sheets

(56) References Cited

U.S. PATENT DOCUMENTS

| | | | |
|---|---|---|---|
| 6,956,285 B2* | 10/2005 | Radu | H01L 23/552 257/659 |
| 7,318,729 B2* | 1/2008 | Sato | G01R 1/07314 257/E23.067 |
| 8,440,504 B2* | 5/2013 | Soussan | H01L 24/81 438/109 |
| 8,692,386 B2* | 4/2014 | Akamatsu | H01L 23/481 257/777 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,947,606 B2* | 4/2018 | Huang | H01L 23/49827 |
| 10,741,480 B2* | 8/2020 | Maldo | H01L 23/49541 |
| 11,081,450 B2* | 8/2021 | Han | H01L 23/36 |
| 2002/0139580 A1 | 10/2002 | Hosaka | H01R 43/24 174/262 |
| 2004/0135238 A1* | 7/2004 | Radu | H01L 23/552 257/678 |
| 2004/0135239 A1* | 7/2004 | Radu | H01L 23/552 257/678 |
| 2005/0215086 A1* | 9/2005 | Sato | H01L 23/49827 439/71 |
| 2011/0006431 A1* | 1/2011 | Soussan | H01L 24/16 257/762 |
| 2012/0193782 A1* | 8/2012 | Akamatsu | H01L 24/16 257/737 |
| 2014/0001645 A1* | 1/2014 | Lin | H01L 23/3171 257/774 |
| 2014/0225258 A1* | 8/2014 | Chiu | H01L 23/49816 257/738 |
| 2014/0252572 A1* | 9/2014 | Hou | H01L 24/96 257/666 |
| 2015/0228550 A1* | 8/2015 | Yu | H01L 21/6835 257/48 |
| 2015/0348872 A1* | 12/2015 | Kuo | H01L 23/522 257/774 |
| 2015/0362526 A1* | 12/2015 | Wu | G01R 31/2601 324/756.01 |
| 2015/0364386 A1* | 12/2015 | Yu | H01L 22/20 257/48 |
| 2016/0307871 A1* | 10/2016 | Tsai | H01L 24/83 |
| 2016/0307872 A1* | 10/2016 | Chen | H01L 23/3135 |
| 2017/0110383 A1* | 4/2017 | Huang | H01L 23/49822 |
| 2017/0133351 A1* | 5/2017 | Su | H01L 25/50 |
| 2019/0304883 A1* | 10/2019 | Maldo | H01R 12/585 |
| 2020/0027844 A1* | 1/2020 | Han | H01L 21/4875 |
| 2020/0219825 A1* | 7/2020 | Lee | H01L 23/3128 |
| 2020/0281102 A1* | 9/2020 | Otsubo | H01L 23/31 |
| 2020/0350363 A1* | 11/2020 | Lim | H01L 23/552 |

\* cited by examiner

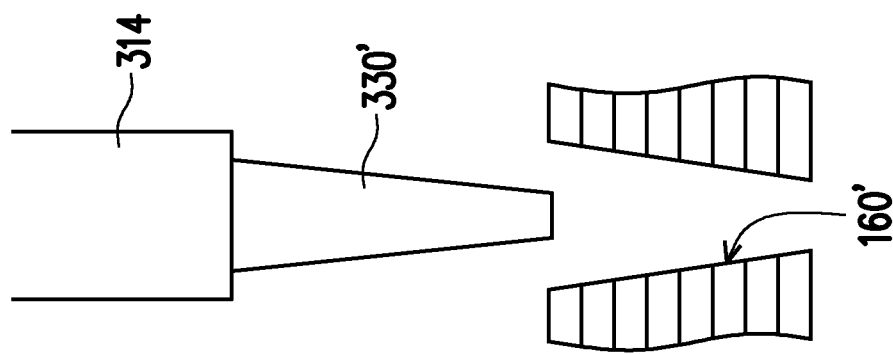

SEMICONDUCTOR PACKAGE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging (e.g., formation of redistribution circuit structure/layer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a schematic cross-section view illustrating a conductive pillar and a through hole of the semiconductor package in accordance with some embodiments of the disclosure.

DETAILED DESCRIPTION

Figure 1A:
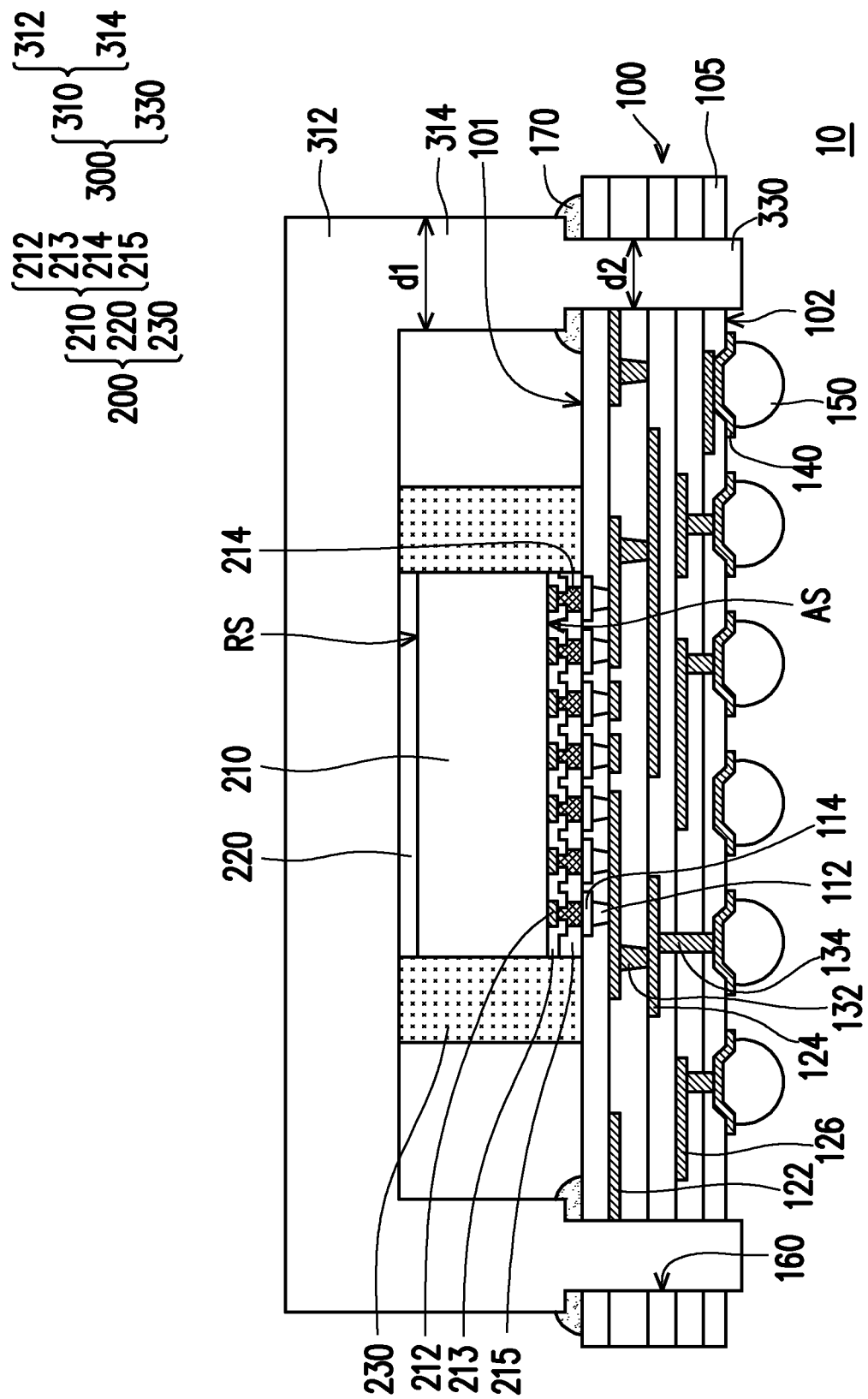
FIG. 1A is a schematic cross-section view illustrating a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
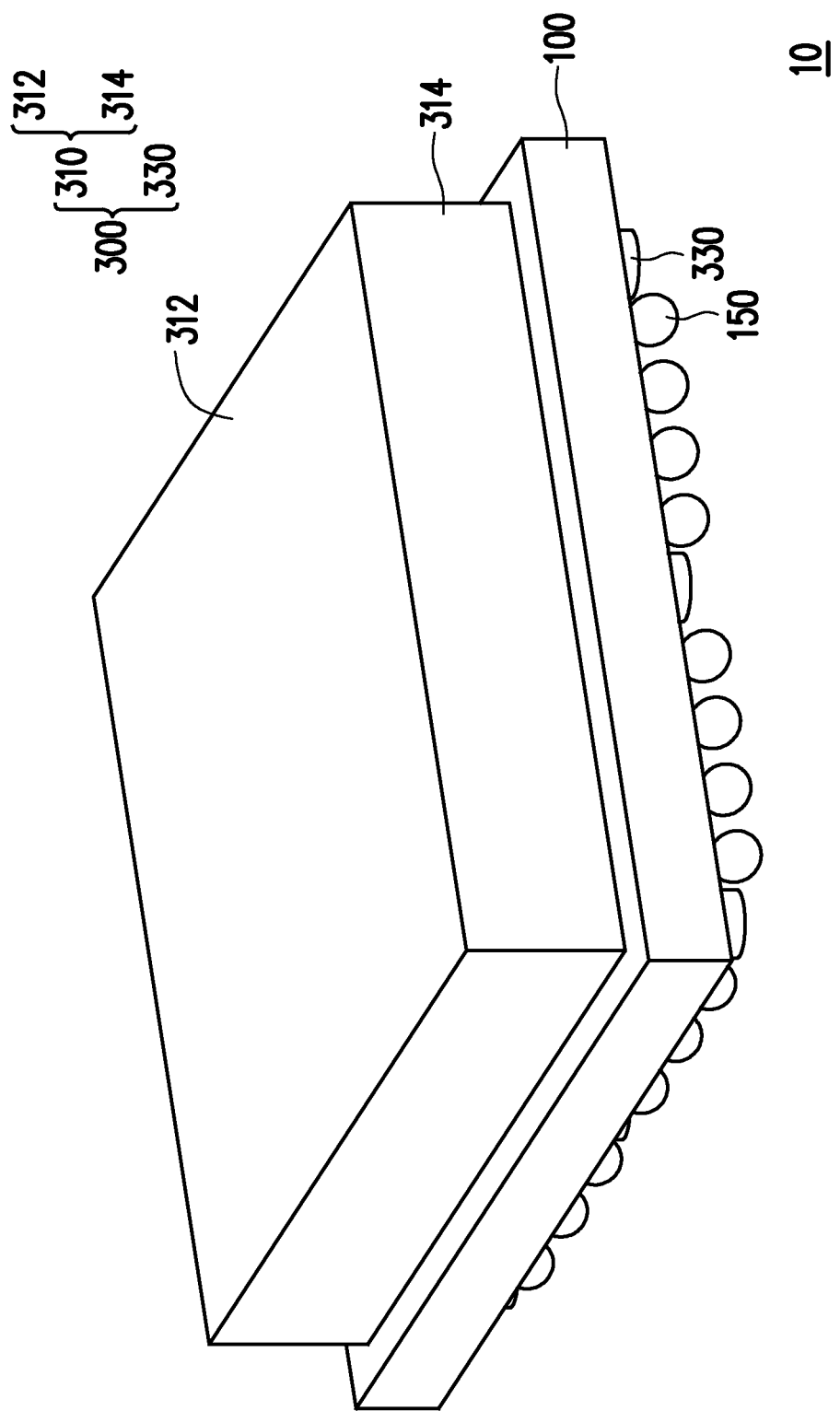
FIG. 1B is a schematic three-dimensional (3D) view illustrating a semiconductor package in accordance with some embodiments of the disclosure.

FIG. 1A is a schematic cross-section view illustrating a semiconductor package 10 in accordance with some embodiments of the disclosure. FIG. 1B is a schematic 3D view illustrating a semiconductor package 10 in accordance with some embodiments of the disclosure. Referring to FIG. 1A and FIG. 1B, the semiconductor package 10 at least includes a multilayer substrate 100, a device die 210, an insulating encapsulant 230, and a shielding structure 300. The multilayer structure 100 has a first surface 101 and a second surface 102 opposite to the surface 101. The multilayer substrate 100 includes through holes 160 disposed therein. Referring to FIG. 1A, each of the through holes 160 extends from the first surface 101 of the multilayer substrate 100 to the second surface 102 thereof and protrudes out form the second surface 102.

In some embodiments, the device die 210 and the insulating encapsulant 230 are both included in a chip structure 200 and disposed on the first surface 101 of the multilayer substrate 100. The device die 210 has an active surface AS and a backside surface RS opposite to the active surface AS. The insulating encapsulant 230 encapsulates and surrounds the device die 210, and the backside surface RS of the device die 210 is exposed from the insulating encapsulant 230. The shielding structure 300 is disposed over the first surface 101 of the multilayer substrate 100. Referring to FIG. 1A and FIG. 1B, the shielding structure 300 includes a cover body 310 and conductive pillars 330 respectively connected to the cover body 310. The cover body 310 covers the device die 210 and the insulating encapsulant 230 of the chip structure 200. Referring to FIG. 1A, the conductive pillars 330 are respectively fitted into the through holes 160 from the first surface 101 of the multilayer substrate 100. For simplification, only two conductive pillars 330 are respectively depicted at two lateral sides of the chip structure 200 as presented in FIG. 1A for illustrative purposes, however it should be noted that the number of the conductive pillars 330 may be more than two. The number of the conductive pillars 330 to be formed may be selected based on the demand.

The device die 210 may include one or more digital dies, analog dies or mixed signal dies, such as application-specific integrated circuit ("ASIC") dies, sensor dies, wireless and radio frequency (RF) dies, memory dies, logic dies or voltage dies, the disclosure is note limited hereto.

In some embodiments, the cover body 310 of the shielding structure 300 includes a cover plate 312 and sidewalls 314. Referring to FIG. 1A and FIG. 1B, the sidewalls 314 are connected to the cover plate 312 and encompassing the device die 210. In some embodiments, the cover plate 312, the sidewalls 314 and the conductive pillars 330 are an integral piece. Moreover, the conductive pillars 330 are respectively connected to and protruded from the bottoms of the sidewalls 314. In some embodiments, the shielding structure 300 is made of one or more conductive metal materials, such as copper, titanium, titanium nitride, tantalum, tantalum nitride, stainless steel, alloys thereof, or combinations thereof. In some embodiments, the cover plate 312 and the sidewalls 314 are of a uniform thickness. In some embodiments not illustrated, the cover plate 312 has a first thickness and the sidewalls are of a second thickness, and the first thickness is different from the second thickness.

In some embodiments, the materials of the insulating encapsulant 230 may include, for example, a resin material (such as epoxy resins, phenolic resins, silicon-containing resins, or other suitable resins), a dielectric material having low permittivity (Dk) and low loss tangent (Df) properties, or other suitable materials. In some embodiments, the insulating encapsulant 230 may further include inorganic fillers (e.g., silica) or other inorganic compounds to optimize coefficient of thermal expansion (CTE) of the insulating encapsulant 230.

Figure 1C:
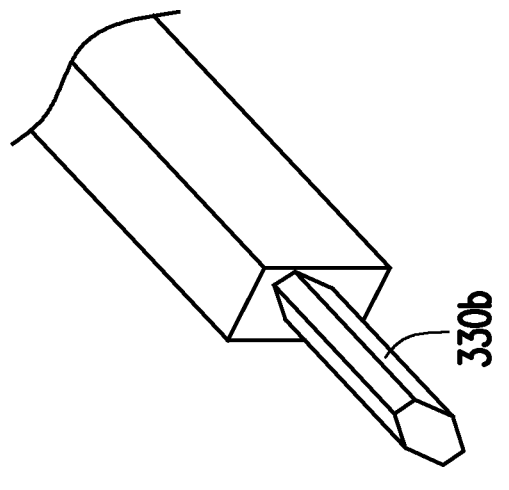
FIG. 1C is a schematic 3D view illustrating conductive pillars of the of semiconductor package in accordance with some embodiments of the disclosure.
Figure 1C:
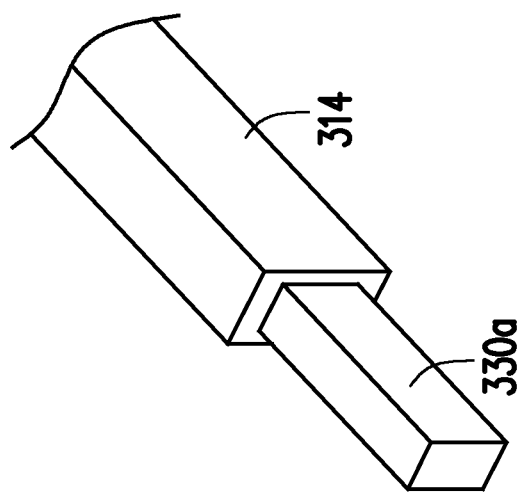

FIG. 1C is a schematic cross-section view illustrating conductive pillars of the of semiconductor package 10 in accordance with some embodiments of the disclosure. Referring to In FIG. 1A and FIG. 1B, in some embodiments, the transverse cross-section of the conductive pillars 330 are in a circular shape. Referring to FIG. 1C, in some embodiments, the transverse cross-section of the conductive pillars 330a and 330b are respectively in a rectangular shape or a hexagonal shape, the disclosure is not limited herein.

Referring to FIG. 1A, a diameter d2 of the conductive pillars 330 may be smaller than the thickness d1 of the sidewalls 314 for fitting the conductive pillars 330 into the through holes 160 of the multilayer substrate 100. In some embodiments, the dimensions of the conductive pillars 330 and the thickness of the sidewalls 314 may be adjusted to meet the required electrical performance of the shielding structure 300. For example, as a lower resistance is required, the conductive pillars 330 with a larger diameter or a larger transverse cross-section area may be made to meet such requirement.

The shielding structure 300 is used for isolating of Electro-Magnetic Interference (EMI). In some embodiments, the shielding structure 300 is made by mechanical stamping press and casting. Accordingly, the shielding structure 300 is premade in advance to the packaging process of semiconductor package 10. In some embodiments, as mentioned above, the cover plate 310 and the sidewalls 330 of the shielding structure 300 may have a uniform thickness in a range of 1 micron to 2 microns, the disclosure is not limited herein. In the current embodiments, due to the shielding structure 300 is premade in advance to the packaging process of the semiconductor package 10, no extra deposition process, such as sputtering, physic vapor deposition (PVD), or the like, would be needed to deposit the EMI shielding film during the packaging process. Accordingly, the processing time of manufacturing the semiconductor package can be greatly reduced.

Figure 2A:
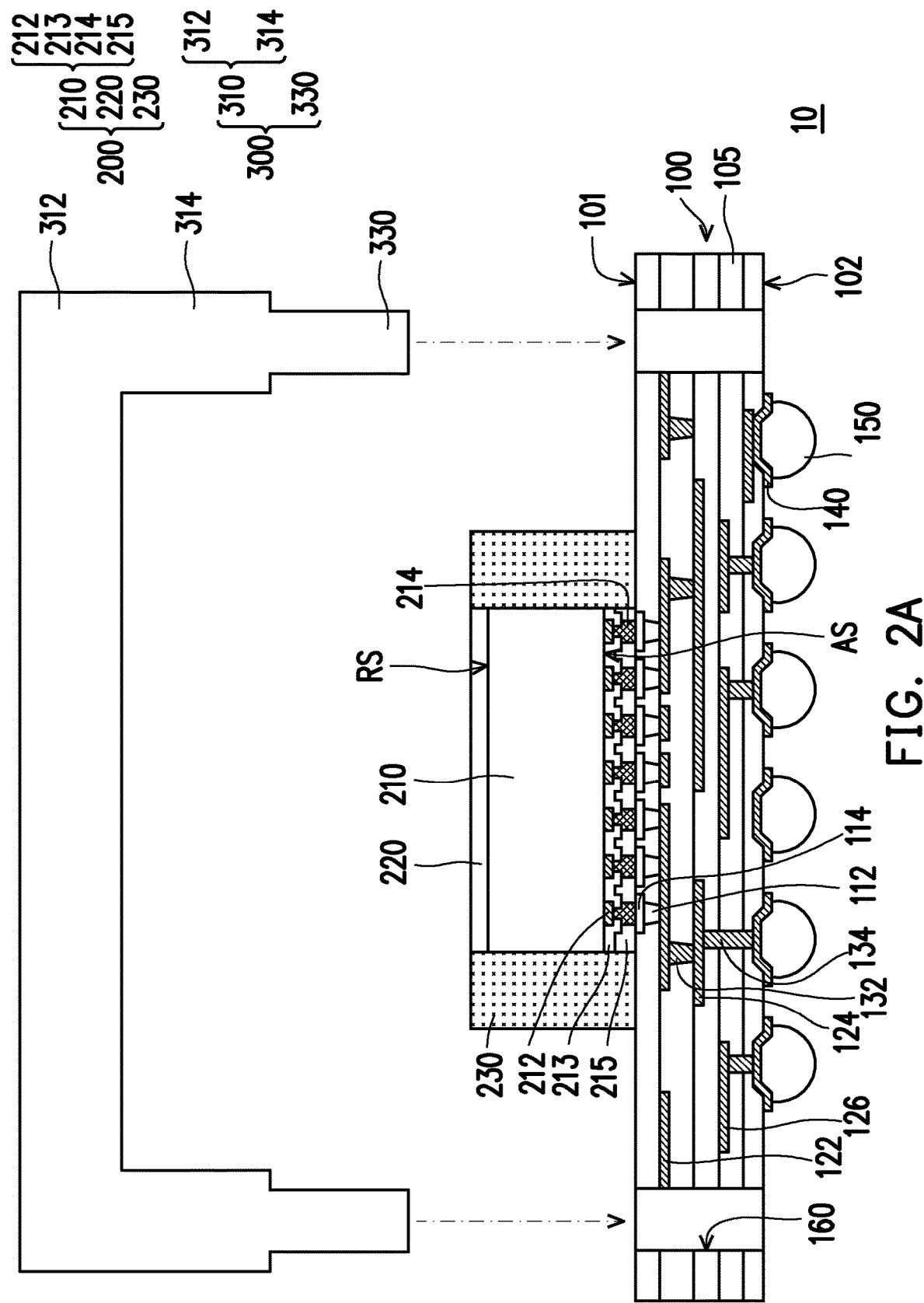
FIG. 2A is a schematic cross-section view illustrating a semiconductor package in accordance with some embodiments of the disclosure.
Figure 2B:
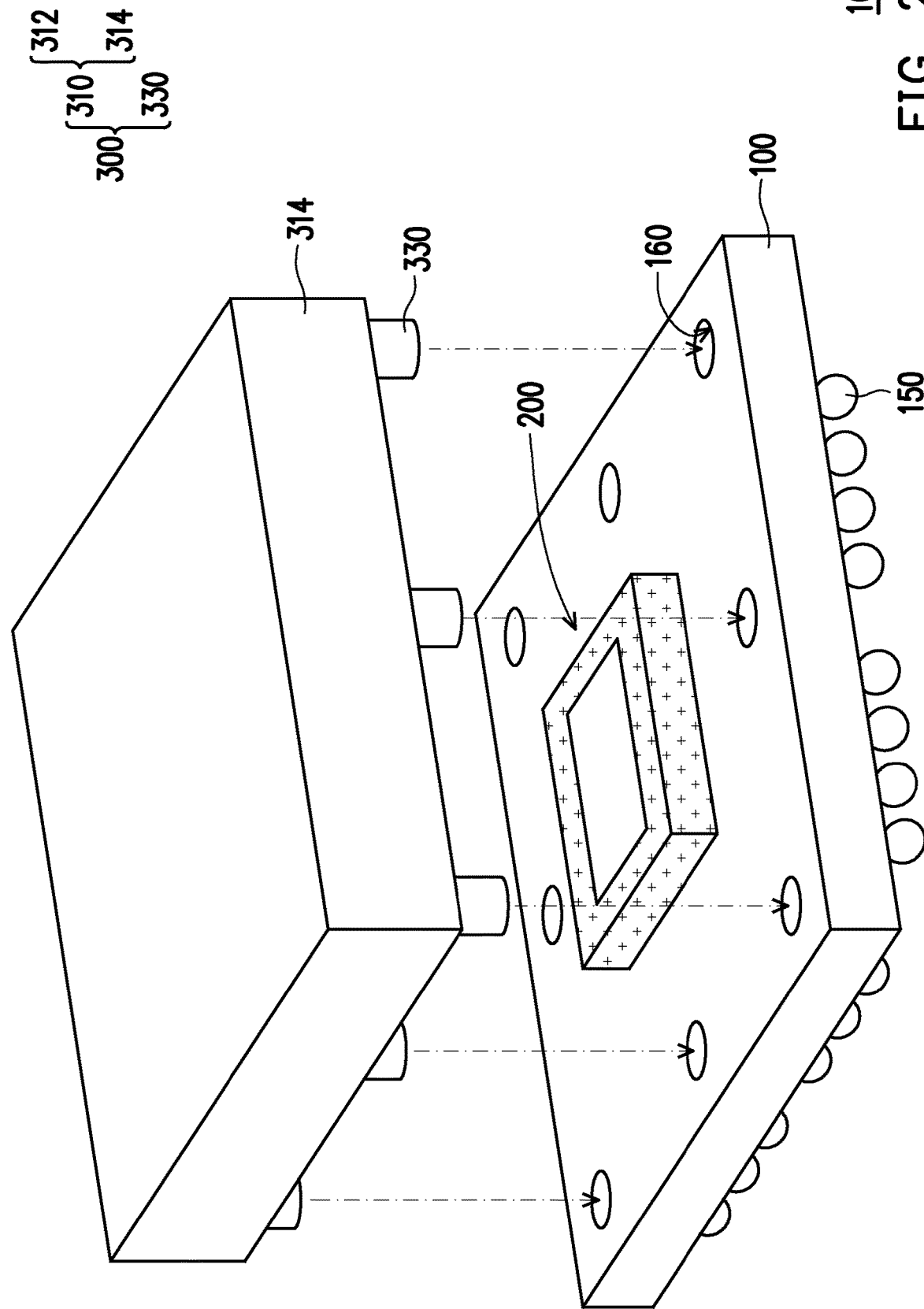
FIG. 2B is a schematic 3D view illustrating a semiconductor package in accordance with some embodiments of the disclosure.

FIG. 2A is a schematic cross-section view illustrating the semiconductor package 10 in accordance with some embodiments of the disclosure. FIG. 2B is a schematic 3D view illustrating a semiconductor package 10 in accordance with some embodiments of the disclosure. Referring to FIG. 2A and FIG. 2B, in some embodiments, the shielding structure 300 is premade and mounted to the multilayer substrate 100 by inserting the conductive pillars into the through holes 160. In some embodiments, the through holes 160 are formed by laser drilling or mechanical drilling method. Referring to FIG. 2A, when the laser drilling method is applied in the multilayer substrate 100 to form the through holes 160, the through holes 160 having an substantially identical diameter from the first surface 101 of the multilayer substrate 100 to the second surface 102 can be formed.

When the through holes 160 having an identical diameter extend uniformly from the first surface 101 to the second surface 102 of the multilayer substrate 100, for fitting the conductive pillars 330 into the multilayer substrate 100, the conductive pillars 330 may have uniform thickness or diameters extending from an end thereof connected to the sidewalls 314 to the other end fitting into the multilayer substrate 100.

In some embodiments, as mentioned, the through holes 160 having an identical diameter extend uniformly from the first surface 101 to the second surface 102 of the multilayer substrate 100. For fitting the conductive pillars 330 into the multilayer substrate 100, the conductive pillars 330 may have uniform thickness or diameters extending from an end thereof connected to the sidewalls 314 to the other end fitting into the multilayer substrate 100.

FIG. 2C is a schematic cross-section view illustrating a conductive pillar and a through hole of the semiconductor package 10 in accordance with some embodiments of the disclosure. Referring to FIG. 2C, as the mechanical drilling method is applied to the multilayer substrate 100 to form the through holes 160', the though holes 160' have a tapered shape (tapered sidewalls) with inner diameters gradually decreased from the first surface 101 to the second surface 102 of the multilayer substrate 100. In the current embodiment, in order to fit the shielding structure 300 into the tapered through holes 160' of the multilayer substrate 100, the tapered shape conductive pillars 330' may be correspondingly disposed on the bottoms of the sidewalls 314 for fitting the conductive pillars 330' into the through holes 160' of the multilayer substrate 100. Referring to again to FIG. 2A, in some embodiments not illustrated, the diameter of the through holes 160 is larger than the diameter of the conductive pillars 330, and a gap formed between the inner surface of the through holes 160 and the conductive pillars 330 may be filled with a conductive adhesive material to fix the conductive pillars 330 inside the through holes 160.

Referring to FIG. 1A and FIG. 2A, in some embodiments, the multilayer substrate 100 includes a plurality of dielectric layers 105 alternatively stacked to each other, a plurality of patterned conductive layers 122, 124, 126, a plurality of UBM patterns 140 disposed on the second surface 102 of the multilayer substrate 100, and a plurality of conductive elements 150 disposed on the UBM patterns 140. In addition, the multilayer substrate 100 includes a plurality of conductive vias 132, 134 vertically disposed between the patterned conductive layers 122, 124, 126, a plurality of pads 114 exposed on the first surface 101, and a plurality of conductive terminals 112 respectively disposed between the pads 114 and the patterned conductive layer 122.

In some embodiments, the UBM patterns 140 are formed by, for example, an electroplating process. In some embodiments, the dielectric layers 105 may be silicon oxide layers, silicon nitride layers, silicon oxy-nitride layers, or dielectric layers formed by other suitable dielectric materials. In some embodiments, the dielectric layers 105 may be formed by deposition or the like. The patterned conductive layers 122, 124, 126 may be patterned copper or other suitable patterned metal layers, and the patterned conductive layers 122, 124, 126 may be formed by electroplating or deposition.

In some embodiments, the conductive elements 150 are respectively formed over the UBM patterns 140. In some embodiments, the conductive elements 150 are attached to the UBM patterns 140 through a solder flux. In the current embodiment, through the conductive elements 150 and/or additional connectors, the chip structure 200 and the multilayer substrate 100 may be further mounted on a circuit substrate (e.g., an organic substrate with circuitry structure embedded therein, such as printed circuit board (PCB), an interposer, an additional package, chips/dies or other electronic devices, to form a stacked package structure, and the disclosure is not limited thereto. In the current embodiments, the through holes 160 for accommodating the conductive pillars 330 are merely disposed in the surrounding edge of the multilayer substrate 100, and thereby only limited deposition space of the conductive elements 150 are sacrificed to accommodate the conductive pillars 330 in the through holes 160.

In some embodiments, the multilayer substrate 100 may be formed with a core layer made of fiberglass reinforced BT (bismaleimide-triazine) resin or FR-4 fiberglass reinforced epoxy resin thereby increasing the mechanical strength of the finished multilayer substrate 100.

Referring to FIG. 1A and FIG. 2A, in some embodiments, the semiconductor package 10 includes a chip structure 200, and the device die 210 and the insulating encapsulant 230 are included in the chip structure 200. The device die 210 has the active surface AS and the backside surface RS opposite to the active surface AS. A plurality of pads 212 are distributed on the active surface AS, and a passivation layer 213 covers the active layer AS and a portion of each of the pads 212. In addition, the chip structure 200 includes a plurality of conductive vias 214 disposed between the pads 212 and the pads 114 exposed on the first surface 101 of the multilayer substrate 100. The conductive vias 214 physically connects the pads 212 partially exposed by the passivation layer 213 to the pads 114 to electrically couple the device die 210 to the multilayer substrate 100. In addition, a protection layer 215 disposed between the passivation layer 213 and the first surface 101 of the multilayer substrate 100 surrounds and protect the conductive vias 214 exposed by the passivation layer 213.

The pads 114 and 212 are, for example, aluminum pads or other suitable metal pads. The conductive vias 214 are, for example, copper pillars, copper alloy pillar or other suitable metal pillars containing copper metal. In some embodiments, the conductive vias 214 are formed by photolithography, plating, photoresist stripping process or any other suitable method. For example, the plating process may include an electroplating plating, an electroless plating or the like.

The current disclosure is not limited thereto. For example, the conductive vias 214 and the protection layer 215 may be omitted. In some embodiments, the material of the device dies 210 include active components (e.g., transistor and/or memories such as N-type metal oxide semiconductor (NMOS) and/or P-type metal-oxide semiconductor (PMOS) devices, or the like), and/or passive components (e.g., resistors, capacitors, inductors or the like) formed therein. In some embodiments, such active components and passive components may be formed in a front-end-of-line (FEOL) process. In an alternative embodiment, the device dies 210 may include a bulk silicon substrate, such a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof.

In some embodiments, the chip package 200 includes a thermal interface material (TIM) layer 220 disposed on the backside surface RS of the device die 210. The TIM layer 220 may include a thermal conductive material such as a polymer material or a metallic material. In some embodiments, the TIM layer 220 is in contact with an inner surface of the cover plate 312 of the shielding structure 300, and the heat generated from the device die 210 may be dissipated to outside through the shielding structure 300 and the TIM layer 220.

Referring to FIG. 1A and FIG. 2A, as mentioned above, the thickness d1 of the sidewalls 314 is greater than the diameter d2 of the conductive pillars 330, and the bottom surfaces of the sidewalls 314 are laterally protruded from an end portion thereof connected with the conductive pillars 330. As depicted in FIG. 1A, the bottom surface of the side walls 314 extrudes in a lateral direction than the conductive pillars 330, and an adhesive 170 is disposed between the bottom surfaces of the sidewalls 314, the side surfaces of the conductive pillars 330, and the first surface 101 of the multilayer substrate 100 to fix the shielding structure 300 on the multilayer substrate 100. In some embodiments, the adhesive 170 is a conductive adhesive such as a silver paste, a solder paste or the like.

Figure 3A:
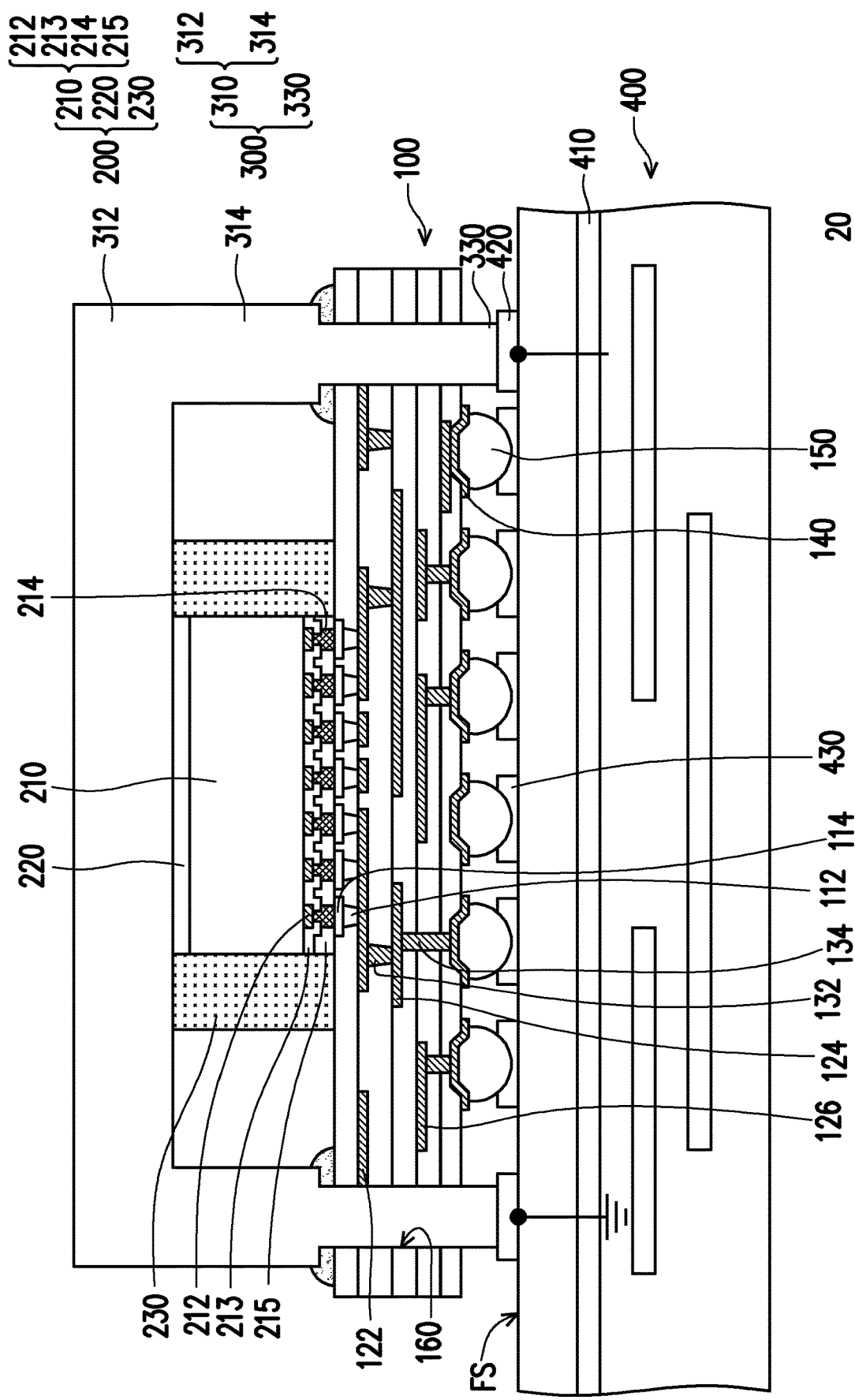
FIG. 3A is a schematic cross-section view illustrating a semiconductor package in accordance with some embodiments of the disclosure.
Figure 3B:
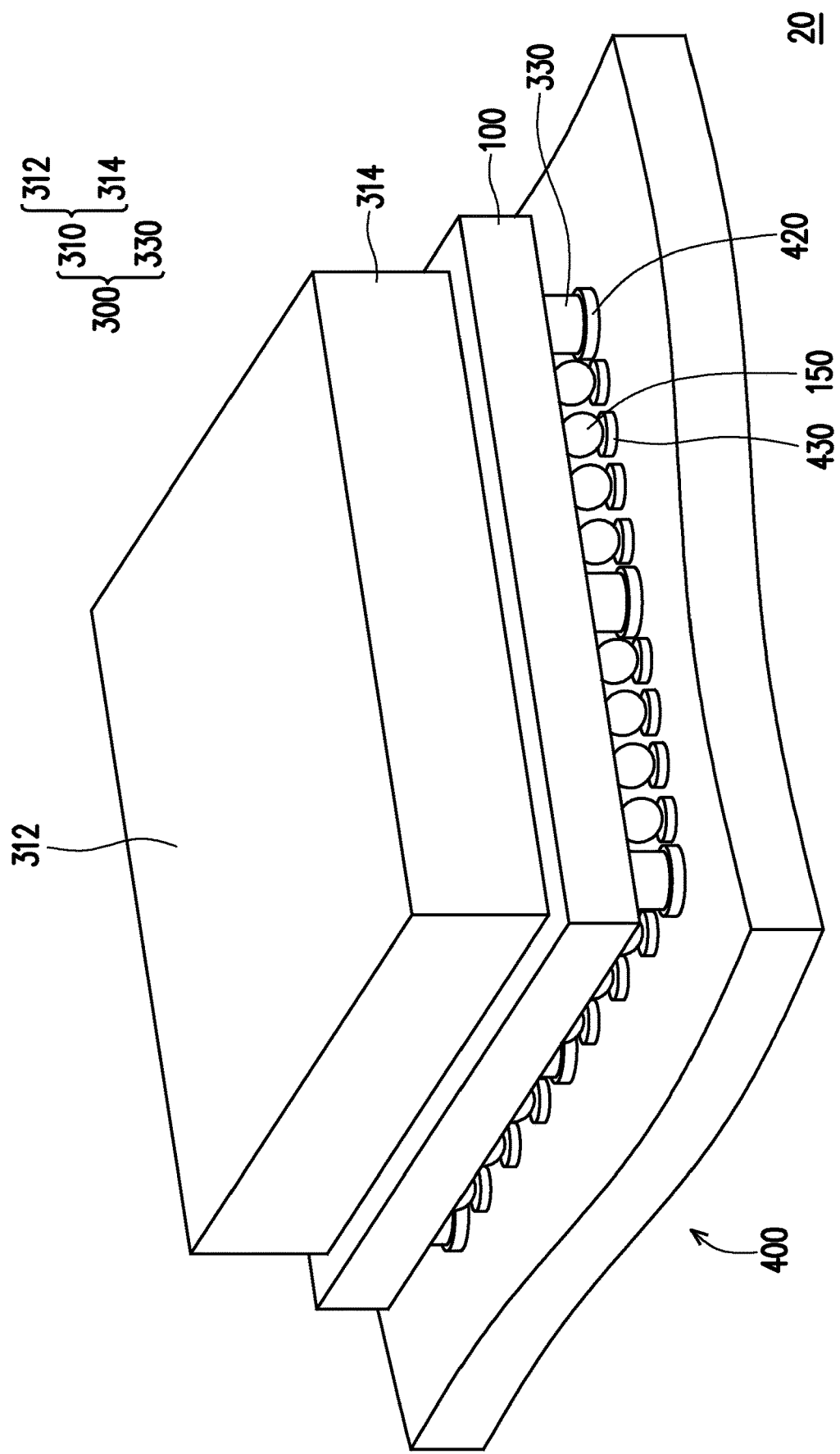
FIG. 3B is a schematic 3D view illustrating a semiconductor package in accordance with some embodiments of the disclosure.

FIG. 3A is a schematic cross-section view illustrating a semiconductor package 20 in accordance with some embodiments of the disclosure. FIG. 3B is a schematic 3D view illustrating a semiconductor package 20 in accordance with some embodiments of the disclosure. Referring to FIG. 3A and FIG. 3B, in the current embodiment, comparing to the semiconductor package 10 in FIG. 1A and FIG. 2A, the semiconductor package 20 further includes a circuit board 400 disposed below the multilayer substrate 100 and electrically connected with the shielding structure 300 through the conducive pillars 330. In some embodiments, the circuit board 400 is, for example, a printed circuit board, an organic substrate with circuitry structure embedded therein, such as a laminate substrate formed as a stack of multiple thin layers (or laminates) of a polymer material such as bismaleimide triazine (BT), $FR_4$, ABF, or the like. In some embodiments, the circuit board 400 may be replaced with an interposer, an additional package, chips/dies or other electronic devices, to form a stacked package structure, and the disclosure is not limited thereto.

In some embodiments, the circuit board 400 includes a plurality circuit layers 410 and a plurality of the ground pads 420. Referring to FIG. 3A and FIG. 3B, a plurality of ground pads 420 are respectively disposed on a front surface FS of the circuit board 400 facing the multilayer substrate 100 corresponding to the portion of the conductive pillars 330 protruded out from the second surface 102 of the multilayer substrate. Referring to FIG. 3A, the conductive pillars 330 of the shielding structure 300 are vertically inserted through the through holes 160 to electrically connect with the ground pads 420. Therefore, a conductive path is formed between the shielding structure 300 and the circuit board 400. The shielding structure 300 is grounded to the ground potential of the circuit board 400 through the ground pads 420. In some embodiments, the ground pads 420 are, for example soldering pads to solder the end of the conductive pillars 330 to the front surface FS of the circuit board 400.

In some embodiments, a plurality of pads 430 are disposed on the front surface FS of the circuit board 400 to receive the conductive elements 150 of the multilayer substrate 100, and the electrically connection are formed between the multilayer substrate 100 and the circuit board 400. In some embodiments, the pads 212 are, for example, aluminum pads or other suitable metal pads, the disclosure is not limited herein.

In some embodiments, the conductive pillars 330 of the shielding structure 300 are connected to the ground pads 420 of the circuit board 400 by pre-solder. In the current embodiments, the conductive pillars 330 are fitted through the multilayer substrate 100 and connected to the ground pads 420 on the front surface FS of the circuit board 400 through soldering. Comparing to the conventional techniques of fixing the EMI shielding structure on a circuit substrate or a circuit board merely by a conductive adhesive, in the current embodiment, the metallic conductive path is directly formed between the shielding structure 300 and the circuit board 400 without relying on the conductive adhesive for electrical connection, and thus the conductive resistance between the shielding structure 300 and the circuit board 400 can be greatly reduced to achieve better grounding effect and EMI shielding effect of the chip structure 200.

In the current embodiments, the conductive pillars 330 are inserted through the through holes 160 formed in the multilayer substrate 100. Referring to FIG. 3A, the overall dimensions, in terms of the width and length, of the shieling structure 300 are smaller than that of the multilayer substrate 100. As a result, the overall dimension of the semiconductor package 30 can be further reduced without being penalized in an expense of increasing the overall size of the package due to deposition of the shielding structure 300 for achieving the EMI shielding effect.

Figure 4A:
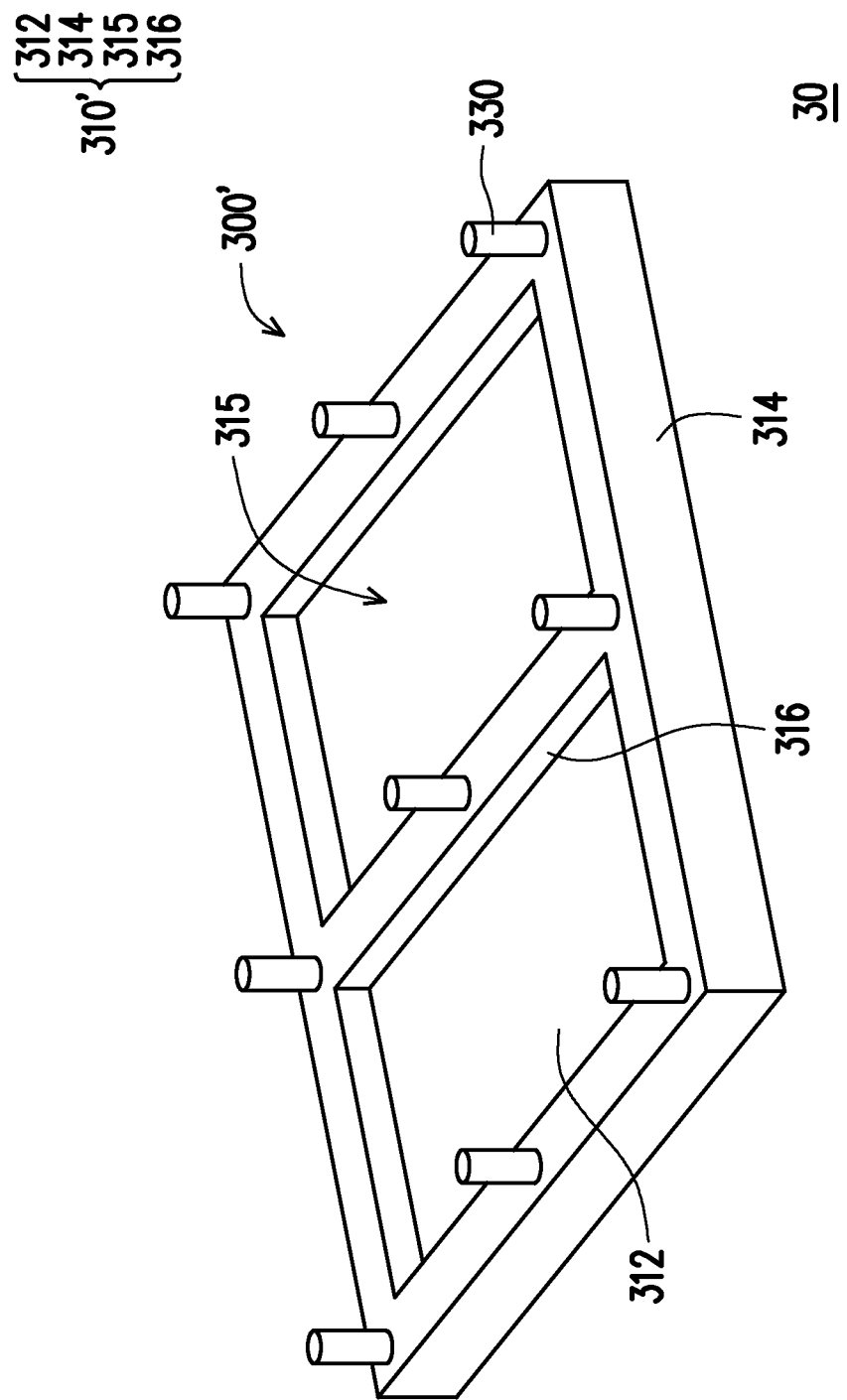
FIG. 4A is a schematic 3D view illustrating a shielding structure of the semiconductor package in accordance with some embodiments of the disclosure.
Figure 4B:
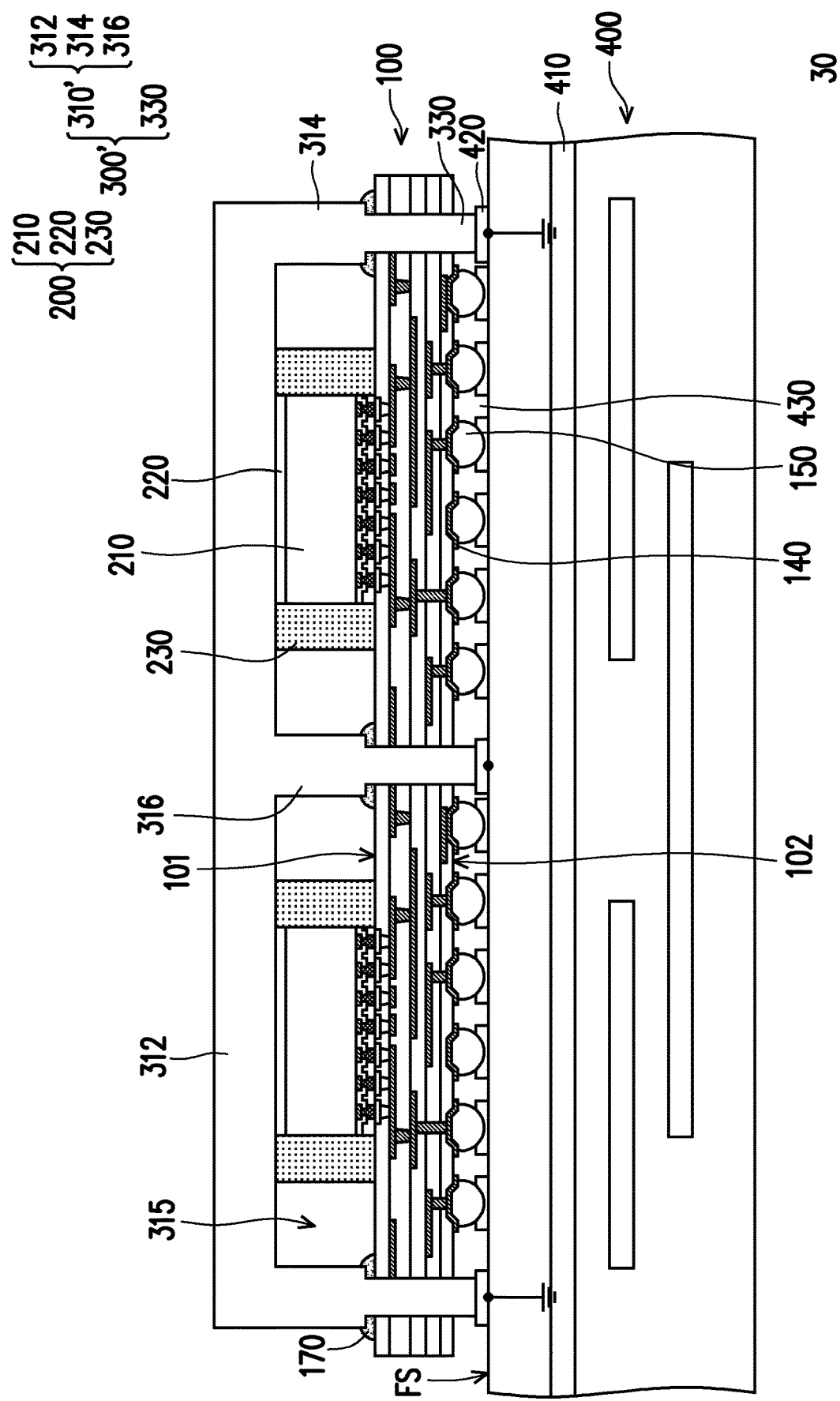
FIG. 4B is a schematic cross-sections view illustrating a semiconductor package in accordance with some embodiments of the disclosure.

FIG. 4A is a schematic 3D view illustrating a shielding structure 300 of the semiconductor package 30 in accordance with some embodiments of the disclosure. FIG. 4B is a schematic cross-section view illustrating a semiconductor package 30 in accordance with some embodiments of the disclosure. Referring to FIG. 4A and FIG. 4B, in the current embodiment, a shielding structure 300' includes the cover body 310 and the conductive pillars 330 connected to the cover body 310. In addition, the cover body 310 includes a cover plate 312 and sidewalls 314 connected to the cover plate 312. The difference between the shielding structure 300' and the shielding structure 300 in the previous embodiments is that the cover body 310' of the shielding structure 300' further includes a compartment wall 316 disposed on the cover plate 310 and encompassed by the sidewalls 314 to define and form compartments 315 inside the shielding structure 300'. For simplification, only one compartment wall 316 is depicted inside of the shielding structure 300' as presented in FIG. 4A for illustrative purposes, and thus merely two compartments 315 are defined and formed. However, it should be noted that the number of the compartment wall 316 may be one or more than one, and thus the number of the compartments 315 formed therefrom would be two or more than two. The number of the compartment wall 316 to be formed and the design of the compartments may be modified based on the product demand.

Referring to FIG. 4B, the in the current embodiment, the conductive pillars 330 are connected to both the bottoms of the sidewalls 312 and the compartment wall 316. Moreover, the multilayer substrate 100 includes the through holes 160 disposed in the multilayer substrate 100 and penetrating from the first surface 101 to the second surface 102 of the multilayer substrate 100. The conductive pillars 330 respectively protruding from the bottoms of the sidewalls 312 and the compartment walls 316 are fitted into the through holes 160 of the multilayer substrate 100. In some embodiments, the adhesive 170 is disposed between the side surfaces of the conductive pillars 330, the bottoms of the sidewalls 312, and the first surface 101 of the multilayer substrate 100 to fix the shielding structure 300' on the multilayer substrate 100 as presented in FIG. 4B.

Referring to FIG. 4B, comparing to the semiconductor package 10 in FIG. 1A to FIG. 3B, the semiconductor package 30 further includes a plurality of the device dies 210 disposed on the first surface 101 of the multilayer substrate 100 and aside to each other. In addition, the chip structures 200 are covered by the cover plate 312 of the cover body 310' and encompassed by the sidewalls 314 and the compartment walls 316 thereof. In the embodiment, each of the chip structures 200 are correspondingly disposed in each of the compartment 315 formed inside of the shielding structure 300'. Referring to FIG. 4B, the compartment 315 may be bigger in size than the chip structure 200 accommodated therein, so that there is void or space around the chip structure 200 (i.e. a gap between the chip structure 200 and the sidewalls 314). In some embodiments, the chip structures 200 respectively disposed on the first surface 101 of the multilayer substrate 100 may include different kinds of device dies 210 encapsulated therein.

In some embodiments, the device dies 210 may include digital dies, analog dies or mixed signal dies, such as application-specific integrated circuit (ASIC) dies, sensor dies, wireless and radio frequency (RF) dies, memory dies, logic dies or voltage dies, the disclose is not limited hereto. Corresponding to the number of the compartments 315 formed inside of the shielding structure 300', it should be noted that the number of the device dies 210 disposed on the first surface 101 of the multilayer substrate 100 may be two or more than two. The number and functional capabilities of the device dies 210 to be disposed may be selected based on the demand.

In some embodiments, the cover plate 312, the sidewalls 314, the compartment walls 316, and the conductive pillars 330 may be integrally formed as an integral piece. In the current embodiment, multiple chip structures 200 (two are shown) are disposed on the first surface 101 of the multilayer substrate 100, and the EMI shielding structure for the multiple chip structures 200 is simultaneously formed through providing and fitting the shielding structure 300' into the multilayer substrate 100 to cover and shield the multiple chip structures 200 disposed on the multilayer substrate 100. Moreover, the shielding structure 300' is grounded to the grounding potential of the circuit board 400 by electrically connecting the conductive pillars 330 to the ground pads 420 disposed on the front surface FS of the circuit board 400.

In the current embodiment, the shielding compartment in a chip-to-chip interference between the chip structures 200 are formed by disposing the shielding structure 300' having the compartment wall 316 on the multilayer substrate 100. Accordingly, there is no needs of extra processes to be applied in the manufacturing the semiconductor package 30, for example, a laser drilling process to make a trench and then refill the trench metal materials, which further simplify the process of forming the EMI shielding compartments between the multiple chip structures 200. In some embodiments, the compartment wall 316 of the shielding structure 300' are formed by, for example, mechanical machining.

Figure 5:
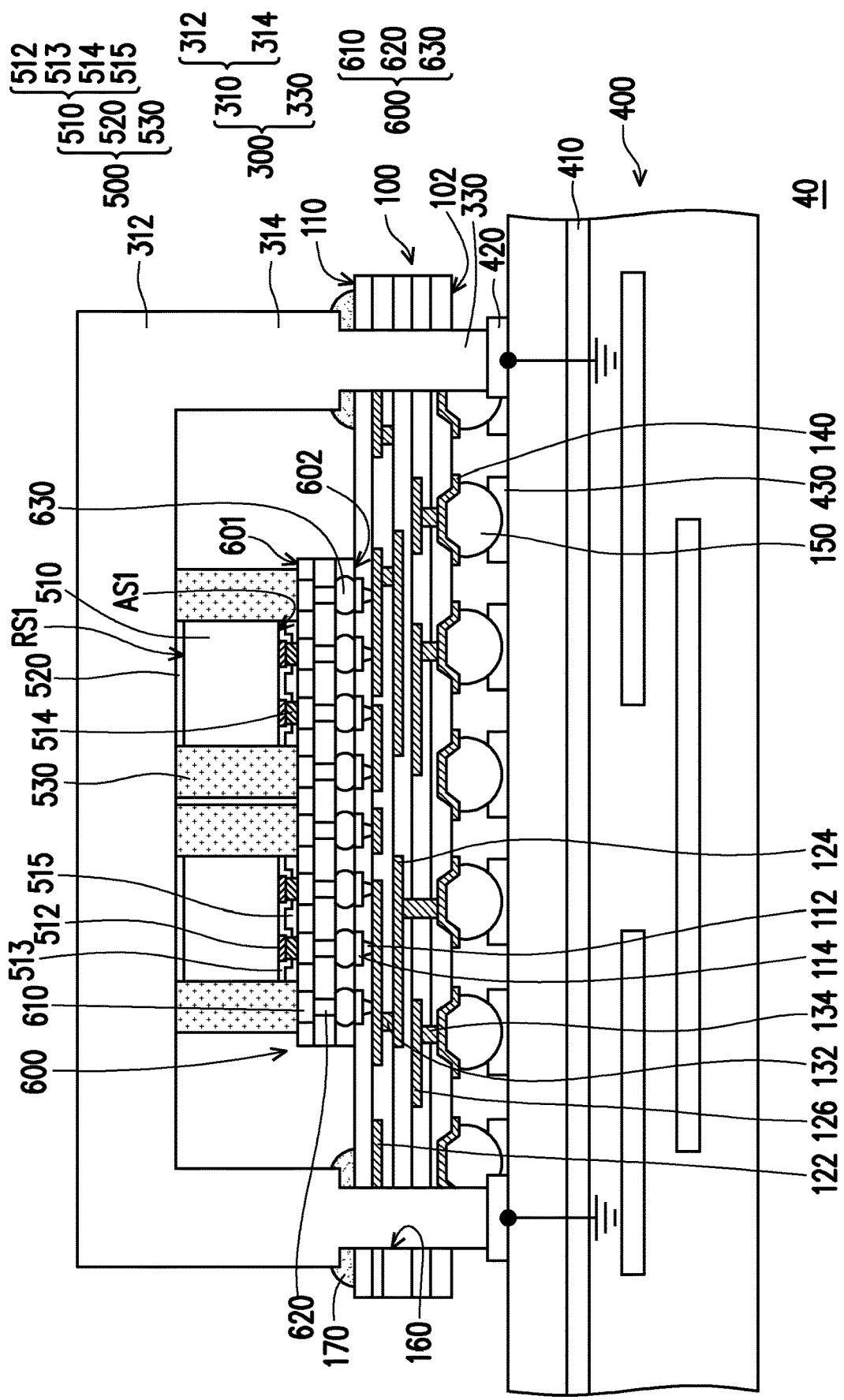
FIG. 5 is a schematic cross-sections view illustrating a semiconductor package in accordance with some embodiments of the disclosure.

FIG. 5 is schematic cross-sections view illustrating a semiconductor package 40 in accordance with some embodiments of the disclosure. In the current embodiment, the shielding structure 300 is applied to a chip-on-wafer-on-substrate (CoWoS) package. Referring to FIG. 5, the semiconductor package 40 differs from the semiconductor package 10 of previous embodiments in FIG. 1A to FIG. 2B that the semiconductor package 30 includes an interposer 600 disposed over the first surface 101 of the multilayer substrate 100. Referring to FIG. 5, the interposer 600 has a front surface 601 and a rear surface 602 opposite to the front surface 601. In some embodiments, a plurality of chip structures 500 are respectively disposed on the first surface 601 of the interposer 600. Referring to FIG. 5, the interposer 600 includes conductive posts 610, conductive bumps 630, and conductive vias 620 disposed between the conducive posts 610 and the conductive bumps 630. The conductive posts 610 are respectively exposed from the first surface 601 of the interposer 600 and electrically connected to device dies 510 in the chip structures 500. Moreover, the conductive bumps 630 are disposed between the conductive vias 620 and the pads 114 exposed on the first surface 101 of the multilayer substrate 100 to electrically connect the conductive vias 620, conductive posts 610 of the interposer 600 and the chip structures 500 to the multilayer substrate 100.

In some embodiments, the interposer 600 may further include a plurality of dielectric layers (not labeled). The material of the dielectric layer may include silicon oxide, silicon nitride, silicon oxynitride, a low dielectric constant (low-K) dielectric material, or any combination thereof.

In some embodiments, the conductive bumps 630 are, for example, solder balls, ball grid array (BGA) balls, or controlled collapse chip connection (C4) bumps. In some embodiments, the conductive posts 610 are made of a conductive material with low resistivity, such as Sn, Pb, Ag, Cu, Ni, Bi, or an alloy thereof.

Each device die 510 has an active surface AS1 and a backside surface RS1, and the conducive posts 610 are electrically connected to the active surface AS1. Referring to FIG. 5, each of the chip structure 500 further includes an insulating encapsulant 530 and a TIM layer 520. The insulating encapsulant 530 encapsulates and encompasses the device die 510, and the TIM layer 520 is disposed on the backside surface RS1 of the device die 510. In some embodiments, the TIM layer 520 are in contact with an inner surface of the cover plate 312. Moreover, a plurality of pads 512 are distributed on the active surface AS1 of the device die 510, and a passivation layer 513 covers the active surface AS and a portion of each of the pads 512. In addition, a plurality of conductive vias 514 physically connects the pads 512 which are partially exposed by the passivation layer 513. In addition, a protection layer 515 surrounds and protects the conductive vias 514 exposed by the passivation layer 513. In some embodiments, the pads 512 are, for example, aluminum pads or other suitable metal pads.

For simplification, only two device dies 510 are depicted on the first surface 601 of the interposer 600 as presented in FIG. 5 for illustrative purposes, and thus merely two device dies 510 are disposed. However, it should be noted that the number of the device dies 510 may be less than two or more than two. The number of the device dies 510 to be disposed may be selected based on the demand.

In some embodiments not illustrated, the shielding structure 300 may be utilized in other modules/applications, such as flip-chip packaging, integrated fan-out (InFO) packaging, fan-out wafer level packaging (WLP), or the like, the disclosure is not limited herein. In some alternative embodiments, the shielding structure 300 may be also utilized in a multiple chip module (MCM) or in the semiconductor packages applied for a networking application or a high performance computing (HPC) application.

In accordance with some embodiments, a semiconductor package includes a multilayer substrate, a device die, an insulating encapsulant, and a shielding structure. The multilayer substrate has a first surface and a second surface opposite to the first surface. The multilayer substrate includes through holes, and each of the through holes extends from the first surface to the second surface. The device die is disposed on the first surface of the multilayer substrate. The insulating encapsulant is disposed on the first surface of the multilayer substrate and encapsulating the device die. The shielding structure is disposed over the first surface of the multilayer substrate. The shielding structure includes a cover body and conductive pillars. The cover body covers the device die, and the insulating encapsulant. The conductive pillars are connected to the cover body and fitted into the through holes of the multilayer substrate.

In accordance with some embodiments, a semiconductor package includes a multilayer substrate, a shielding structure, a device dies and an insulating encapsulant. The multilayer substrate has a first surface and a second surface opposite to the first surface. The multilayer substrate includes through holes, and each of the through holes extends from the first surface to the second surface. The shielding structure includes a cover plate, sidewalls, conductive pillars and the compartment walls. The sidewalls are disposed on the cover plate. The conductive pillars respectively protrude from the sidewalls and are fitted into the through holes of the multilayer substrate. The compartment walls are disposed on the cover plate and encompassed by the sidewalls to define compartments in the shielding structure. The device dies are disposed on the multilayer structure. The device dies are correspondingly accommodated in the compartments. The insulating encapsulant encapsulates the device dies on the multilayer structure. Moreover, the insulating encapsulant and the device dies are covered by the shielding structure.

In accordance with some embodiments, a semiconductor package includes an interposer, device die, a multilayer substrate, a shielding structure, and a circuit board. The device dies are disposed on the interposer and electrically connected with the interposer. The multilayer substrate had a first surface and a second surface opposite to the first surface. The multilayer substrate includes through holes. The interposer is disposed between the device dies and the first surface of the multilayer substrate. The device dies are electrically connected to the multilayer substrate through the interposer. The shielding structure is disposed on the multilayer structure and covers the device dies and the interposer. The circuit board is disposed below the multilayer substrate and electrically connected with the multilayer structure. The shielding structure includes conductive pillars. The conductive pillars are fitted into the through holes of the multilayer substrate and protruded out from the second surface of the multilayer substrate. The conductive pillars are connected to the circuit board to electrically connect the shielding structure with the circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a multilayer substrate having a first surface and a second surface opposite to the first surface, wherein the multilayer substrate comprises through holes, and each of the through holes extends from the first surface to the second surface;
a device die disposed on the first surface of the multilayer substrate;
an insulating encapsulant, disposed on the first surface of the multilayer substrate and encapsulating the device die; and
a shielding structure disposed over the first surface of the multilayer substrate, wherein the shielding structure comprises a cover body and conductive pillars, the cover body fully encapsulates the device die and the insulating encapsulant, the conductive pillars are connected to the cover body and fitted into the through holes of the multilayer substrate,
wherein the cover body comprises a cover plate and sidewalls connected with the cover plate,
wherein outer side surfaces of the cover plate are respectively aligned with outer surfaces of the sidewalls, and a thickness of the sidewalls is greater than a thickness of the conductive pillars,
wherein the conductive pillars are protruded out from the second surface of the multilayer substrate.

2. The semiconductor package as claimed in claim 1, further comprising an adhesive disposed between the cover body, the conductive pillars and the multilayer substrate to fix the shielding structure to the multilayer substrate.

3. The semiconductor package as claimed in claim 1, wherein
sidewalls encompass the device die.

4. The semiconductor package as claimed in claim 3, wherein a diameter of each of the conductive pillars is smaller than a thickness of the sidewalls.

5. The semiconductor package as claimed in claim 1, wherein the cover body and the conductive pillars are an integral piece.

6. The semiconductor package as claimed in claim 1, further comprising a circuit board disposed below the multilayer substrate and electrically connected with the shielding structure through the conductive pillars,
wherein the conductive pillars are respectively inserted through the through holes to be electrically connected with the circuit board.

7. The semiconductor package as claimed in claim 6, further comprising a plurality of ground pads disposed on the circuit board, wherein the shielding structure is electrically coupled to the ground pads and grounded through the circuit board.

8. The semiconductor package as claimed in claim 6, further comprising a plurality of conductive elements disposed between the multilayer substrate and the circuit board to electrically connect the multilayer substrate and the circuit board.

9. The semiconductor package as claimed in claim 1, wherein shapes of transverse cross sections of the conductive pillars comprise a circular shape, a rectangular shape, or a hexagonal shape.

10. The semiconductor package as claimed in claim 1, wherein an inner diameter of the through holes is gradually reduced from the first surface of the multilayer substrate to the second surface thereof.

11. A semiconductor package, comprising:
a multilayer substrate having a first surface and a second surface opposite to the first surface, wherein the multilayer substrate comprises through holes and a plurality of under-bump metallization (UBM) patterns, and each of the through holes extends from the first surface to the second surface, and the plurality of UBM patterns are disposed on the second surface of the multilayer substrate;
a shielding structure, comprising:
a cover plate;
sidewalls disposed on the cover plate;
conductive pillars respectively protruding from the sidewalls and fitted into the through holes of the multilayer substrate; and
compartment walls disposed on the cover plate and encompassed by the sidewalls to form compartments in the shielding structure;
device dies disposed on the multilayer structure, wherein the device dies are correspondingly accommodated in the compartments; and
an insulating encapsulant encapsulating the device dies on the multilayer structure, wherein the insulating encapsulant and the device dies are covered by the shielding structure.

12. The semiconductor package as claimed in claim 11, further comprising
a circuit board disposed below the multilayer structure and electrically connected to the shielding structure through the conductive pillars.

13. The semiconductor package as claimed in claim 12, further comprising a plurality of ground pads disposed on the circuit board, wherein the shielding structure is electrically connected to the ground pads and grounded through the circuit board.

14. The semiconductor package as claimed in claim 13, wherein the conductive pillars are respectively inserted through the through holes and protruding from the second surface of the multilayer substrate to be electrically connected to the ground pads.

15. The semiconductor package as claimed in claim 11, further comprising a thermal interface material layer disposed between surfaces of the device dies and the cover plate of the shielding structure.

16. The semiconductor package as claimed in claim 11, wherein the cover plate, the sidewalls, the compartment walls, and the conductive pillars are an integral piece.

17. A semiconductor package, comprising:
an interposer;
device dies disposed on the interposer and electrically connected with the interposer;
a multilayer substrate having a first surface and a second surface opposite to the first surface, wherein the multilayer substrate comprises through holes, the interposer is disposed between the device dies and the first surface of the multilayer substrate, and the device dies are electrically connected to the multilayer substrate through the interposer;
a shielding structure disposed on the multilayer structure and covering the device dies and the interposer; and
a circuit board disposed below the multilayer substrate and electrically connected with the multilayer structure,
wherein the shielding structure comprises conductive pillars, the conductive pillars are fitted into the through holes of the multilayer substrate and protruded out from the second surface of the multilayer substrate, the conductive pillars are connected to the circuit board to electrically connect the shielding structure with the circuit board.

18. The semiconductor package as claimed in claim 17, wherein the shielding structure comprising:
a cover plate; and
sidewalls disposed on the cover plate,
wherein the conductive pillars are respectively protruded from bottoms of the side walls.

19. The semiconductor package as claimed in claim 17, wherein the shielding structure is made of copper, titanium, titanium nitride, tantalum, tantalum nitride, stainless steel, alloys thereof, or combinations thereof.

20. The semiconductor package as claimed in claim 17, further comprising a plurality of ground pads disposed on the circuit board, wherein the shielding structure is electrically connected to the ground pads and grounded through the circuit board.

* * * * *